(12) United States Patent
Yoshizawa et al.

(10) Patent No.: US 8,477,474 B2
(45) Date of Patent: Jul. 2, 2013

(54) THIN FILM CAPACITOR

(75) Inventors: Toshiyuki Yoshizawa, Tokyo (JP); Akira Furuya, Tokyo (JP); Masaomi Ishikura, Tokyo (JP); Keisuke Takasugi, Tokyo (JP); Hiroshi Take, Tokyo (JP)

(73) Assignee: TDK Corporation, Tokyo (JP)

( * ) Notice: Subject to any disclaimer, the term of this patent is extended or adjusted under 35 U.S.C. 154(b) by 301 days.

(21) Appl. No.: 12/717,643

(22) Filed: Mar. 4, 2010

(65) Prior Publication Data
US 2010/0246090 A1 Sep. 30, 2010

(30) Foreign Application Priority Data
Mar. 26, 2009 (JP) .................. 2009-076077

(51) Int. Cl.
*H01G 4/00* (2006.01)
*H01G 4/005* (2006.01)

(52) U.S. Cl.
USPC ................. 361/301.4; 361/311; 361/303

(58) Field of Classification Search
USPC .................. 361/303, 305, 311, 301.4
See application file for complete search history.

(56) References Cited

U.S. PATENT DOCUMENTS

| 5,508,881 | A * | 4/1996 | Stevens .................. 361/305 |
| 5,554,564 | A * | 9/1996 | Nishioka et al. .......... 438/396 |
| 6,255,187 | B1 * | 7/2001 | Horii ..................... 438/396 |
| 6,835,976 | B2 * | 12/2004 | Lin et al. ................ 257/310 |
| 6,844,581 | B2 * | 1/2005 | Sitaram et al. ............ 257/295 |
| 6,855,973 | B2 * | 2/2005 | Otabe et al. ............. 257/295 |
| 2006/0211212 | A1 | 9/2006 | Baniecki et al. |

FOREIGN PATENT DOCUMENTS
JP A-2006-5293 1/2006
JP A-2006-261328 9/2006

* cited by examiner

*Primary Examiner* — Eric Thomas
(74) *Attorney, Agent, or Firm* — Oliff & Berridge, PLC

(57) ABSTRACT

To provide a thin film capacitor having a device structure for suppressing peeling between an insulating film and a substrate. A thin film capacitor 100 has a laminate structure that is formed by laminating a lower electrode 20, a dielectric film 30, and an upper electrode 40 in sequence on a substrate 10. An adhesion layer 41 is formed on a side surface of the lower electrode 20 via the dielectric film 30, and an insulating film 50 in contact with the adhesion layer 41 covers the laminate structure. According to this device structure, the adhesion layer 41 having excellent adhesiveness to the insulating film 50 is disposed between the insulating film 50 and the dielectric film 30, so that peeling of the insulating film 50 can be suppressed.

4 Claims, 6 Drawing Sheets

(A)

(B)

(C)

(A)

(B)

(C)

(A)

(B)

(C)

(A)

(B)

(C)

THIN FILM CAPACITOR

BACKGROUND OF THE INVENTION

1. Field of the Invention

The present invention relates to a thin film capacitor having a device structure for suppressing peeling between an insulating film and a substrate.

2. Description of the Related Art

A thin film capacitor is widely used in semiconductor devices, mounting circuit boards, electronic circuits, and so on. As a device structure of the thin film capacitor, various structures are being studied in light of high reliability. For example, Japanese Patent Application Laid-Open No. 2006-5293 proposes the following device structure as a device structure of a thin film capacitor having a laminate structure that is formed by laminating a lower electrode, a dielectric film, and an upper electrode in sequence on a substrate. In the proposed device structure, an insulating resin layer that has an opening for exposing the dielectric film and covers a periphery of the dielectric film is formed, and the upper electrode is laminated on the dielectric film exposed from the opening of the insulating resin layer. According to such a device structure, a poorly covered portion of the dielectric film between the lower electrode and the upper electrode can be covered with the insulating resin layer, so that a decrease in breakdown voltage can be suppressed.

[Patent Document 1] Japanese Patent Application Laid-Open No. 2006-5293

However, in the device structure disclosed in this patent document, the lower electrode has steps, and so a thickness of the insulating resin layer covering the laminate structure on the lower electrode and a thickness of the insulating resin layer covering the substrate and a side surface of the lower electrode are different. Such a difference in thickness of the insulating resin layer affects a stress generated due to a difference between a thermal expansion coefficient of the insulating resin layer and a thermal expansion coefficient of the lower electrode, and can cause peeling of the insulating resin layer on the side surface of the lower electrode.

SUMMARY OF THE INVENTION

Thus, an object of the present invention is to solve the above-mentioned problem and provide a thin film capacitor having a device structure for suppressing peeling between an insulating film and a substrate.

To achieve the stated object, a thin film capacitor according to the present invention has a laminate structure that is formed by laminating a first electrode, a dielectric film, and a second electrode in sequence on a substrate, and includes: an adhesion layer that is formed on a side surface of the first electrode via the dielectric film; and an insulating film that is in contact with the adhesion layer and covers the laminate structure. According to this device structure, the adhesion layer having excellent adhesiveness to the insulating film is disposed between the insulating film and the dielectric film. Therefore, peeling of the insulating film caused by thermal expansion or thermal contraction of the insulating film and the like can be suppressed.

For example, it is preferable that the adhesion layer is a metal thin film made of a material that oxidizes more easily than the dielectric film. This makes oxygen molecules in the insulating film more easily incorporated into the adhesion layer by an oxidation reaction and the like. Hence, it is possible to suppress property degradation and the like of the thin film capacitor caused by a composition change of the dielectric film that occurs as a result of the dielectric film taking in oxygen molecules from the insulating film.

For example, a preferred embodiment of the adhesion layer is a seed layer for depositing the second electrode by electroplating. Such a seed layer can be formed on side and upper surfaces of the first electrode via the dielectric film by a predetermined thin film process. By removing the seed layer formed on the upper surface of the first electrode via the dielectric film by physical etching, the seed layer as the adhesion layer can be formed on the side surface of the first electrode via the dielectric film.

In addition to the device structure described above, it is preferable to form an electrode lead portion that is led from an opening in the insulating film and electrically connected to the second electrode. This electrode lead portion effectively suppresses peeling between the insulating film and the substrate.

According to the present invention, a thin film capacitor having a device structure for suppressing peeling between an insulating film and a substrate can be provided.

DESCRIPTION OF THE PREFERRED EMBODIMENTS

Figure 1:
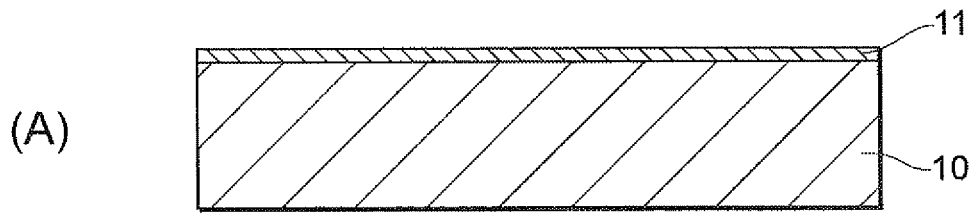
FIG. 1 is a sectional view in a manufacturing process of a thin film capacitor according to an embodiment.
Figure 1:
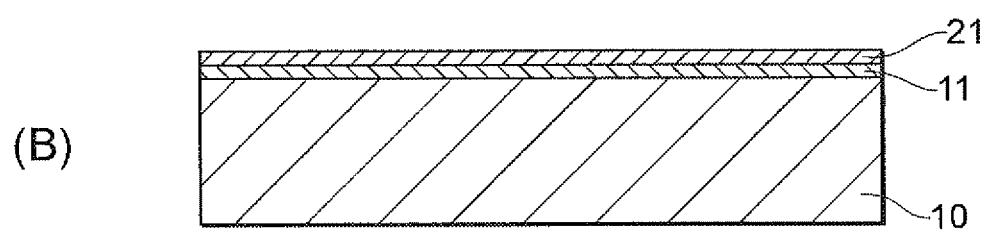
Figure 1:
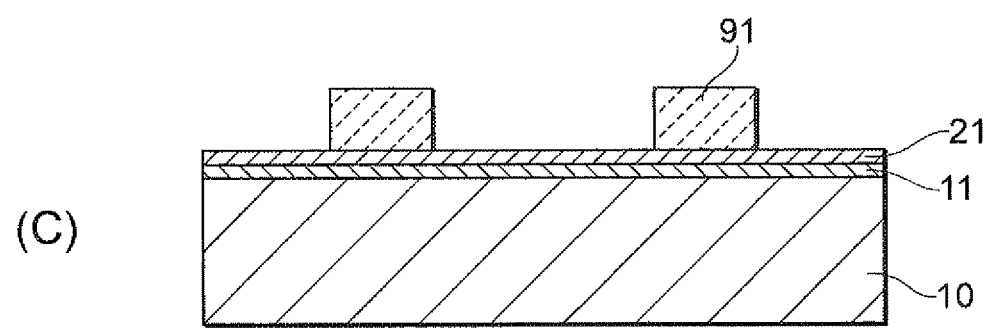
Figure 2:
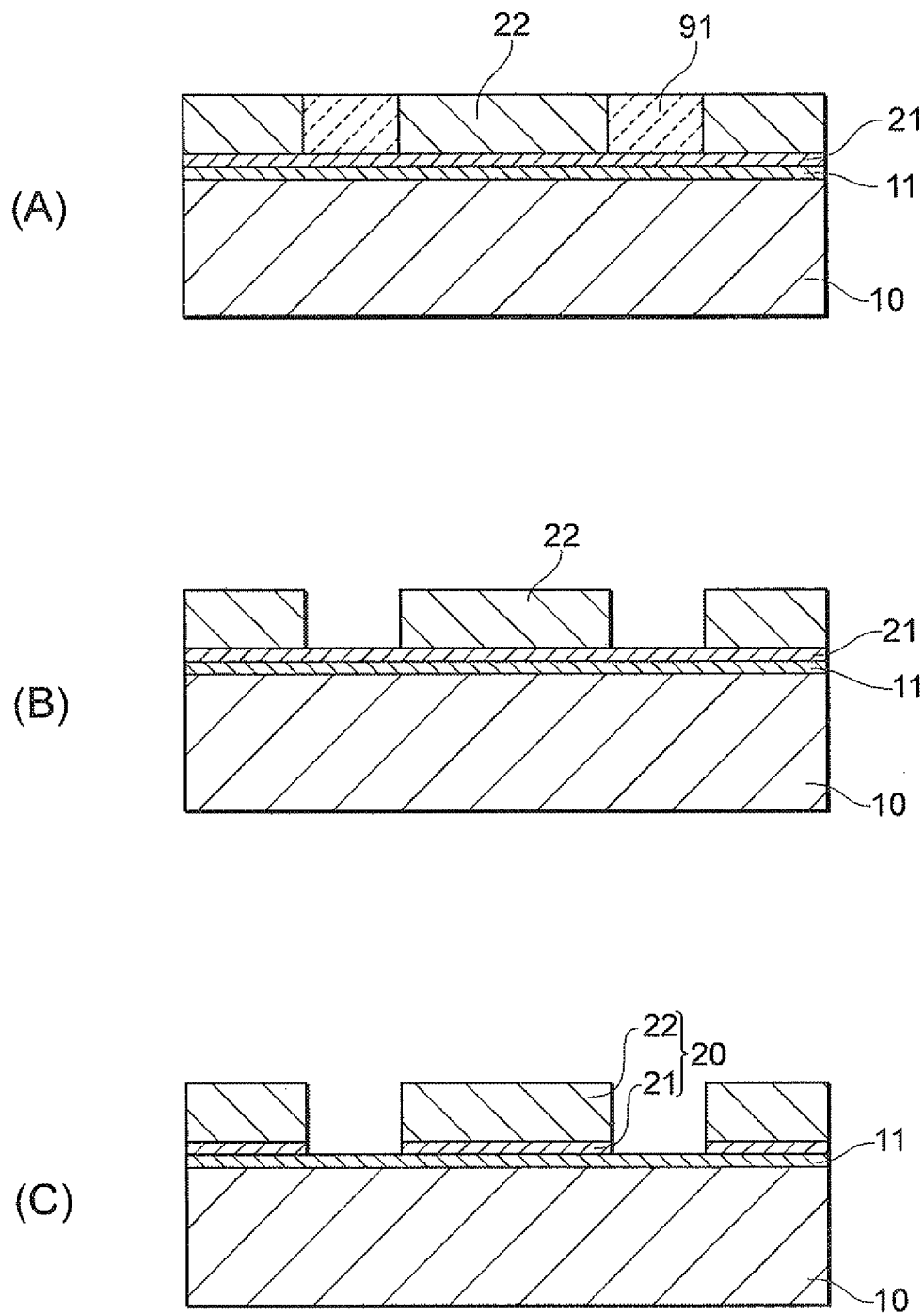
FIG. 2 is a sectional view in the manufacturing process of the thin film capacitor according to the embodiment.
Figure 3:
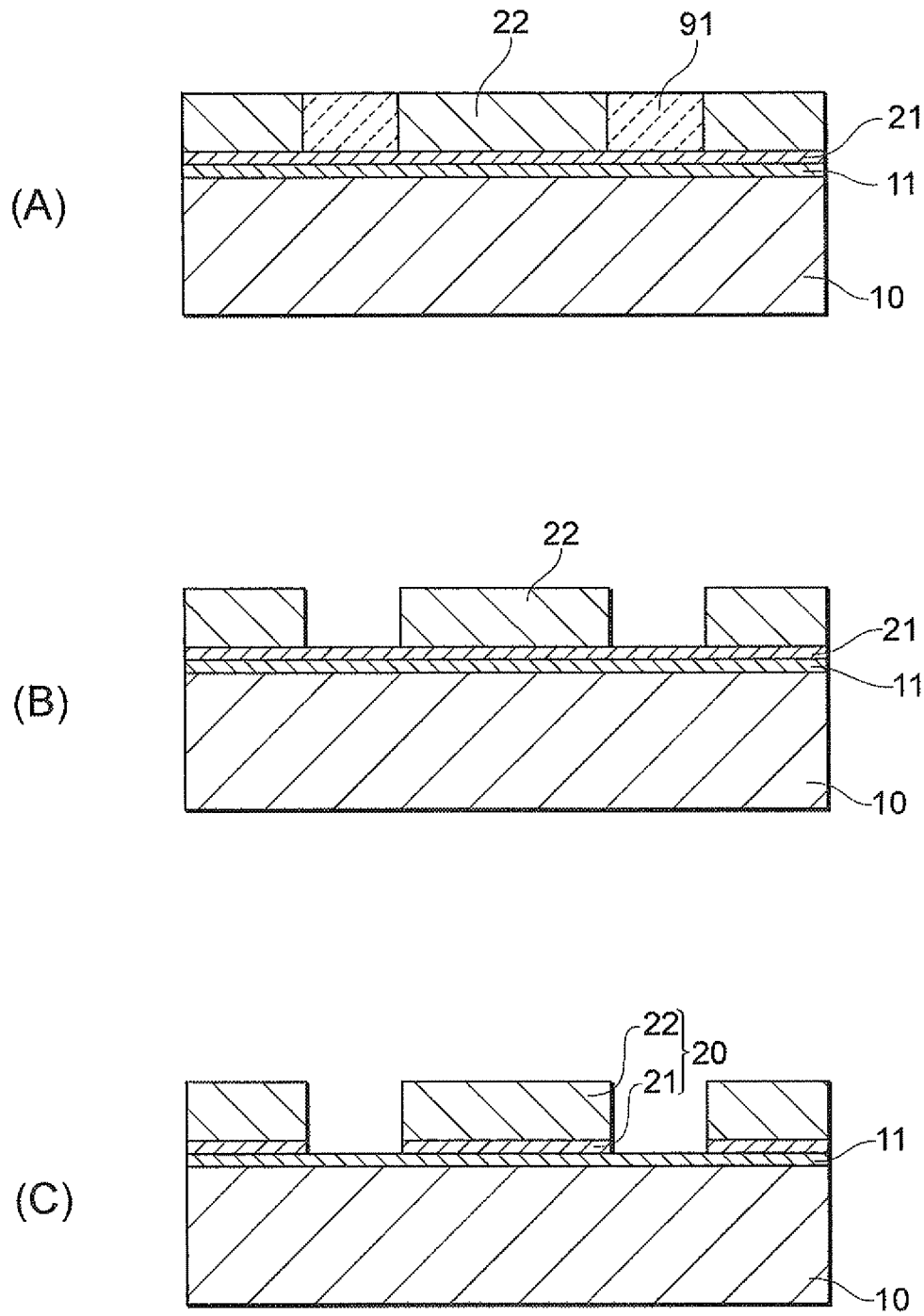
FIG. 3 is a sectional view in the manufacturing process of the thin film capacitor according to the embodiment.
Figure 4:
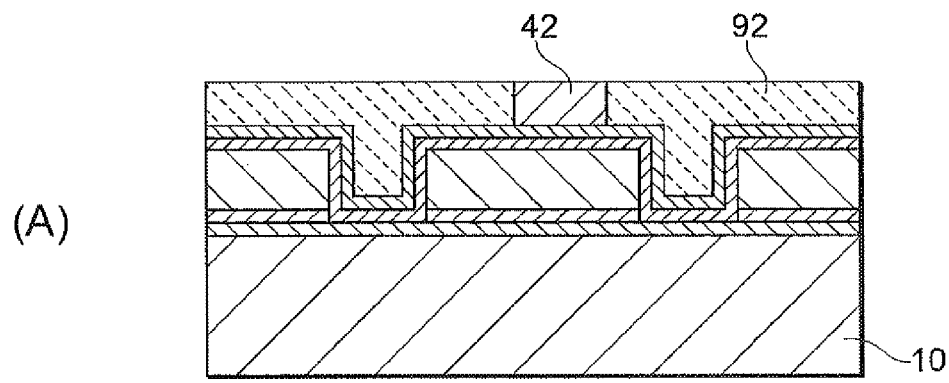
FIG. 4 is a sectional view in the manufacturing process of the thin film capacitor according to the embodiment.
Figure 4:
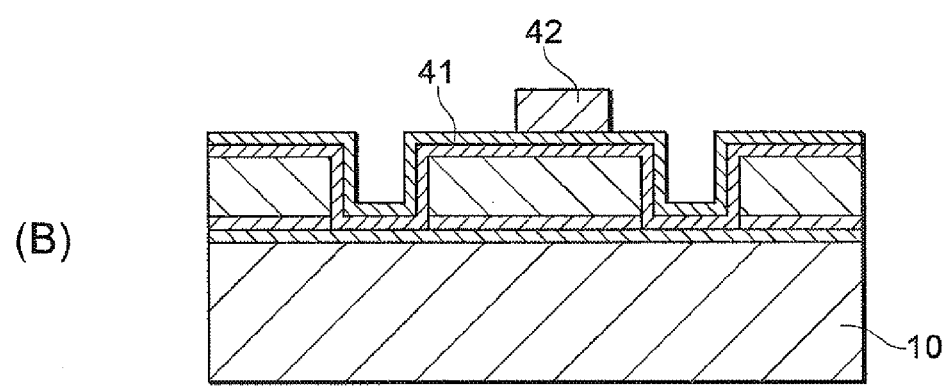
Figure 4:
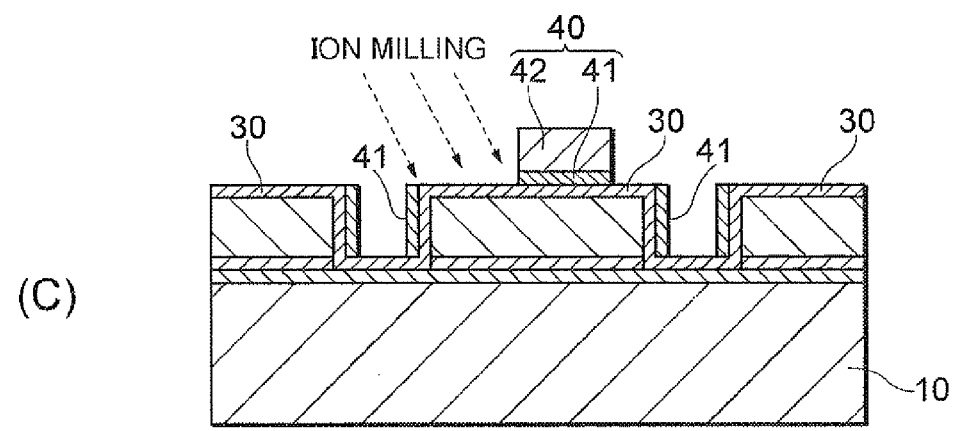
Figure 5:
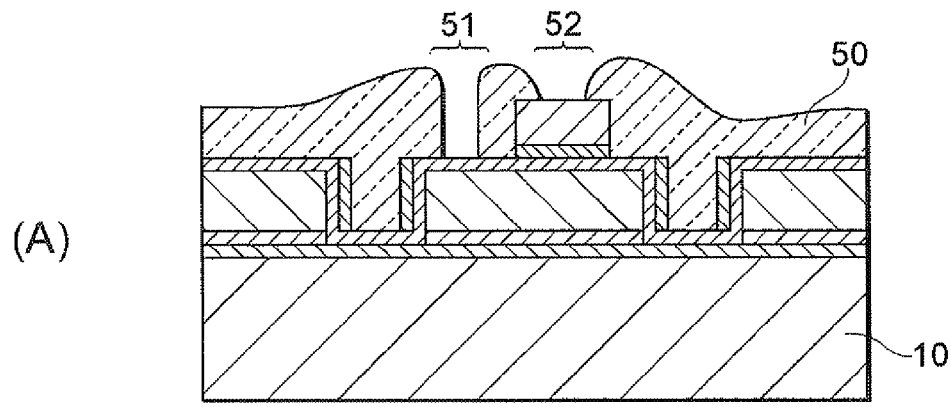
FIG. 5 is a sectional view in the manufacturing process of the thin film capacitor according to the embodiment.
Figure 5:
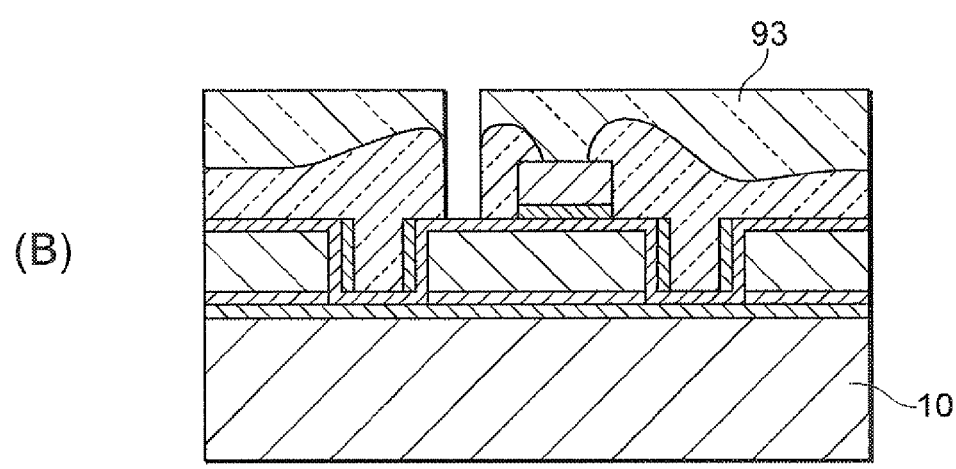
Figure 5:
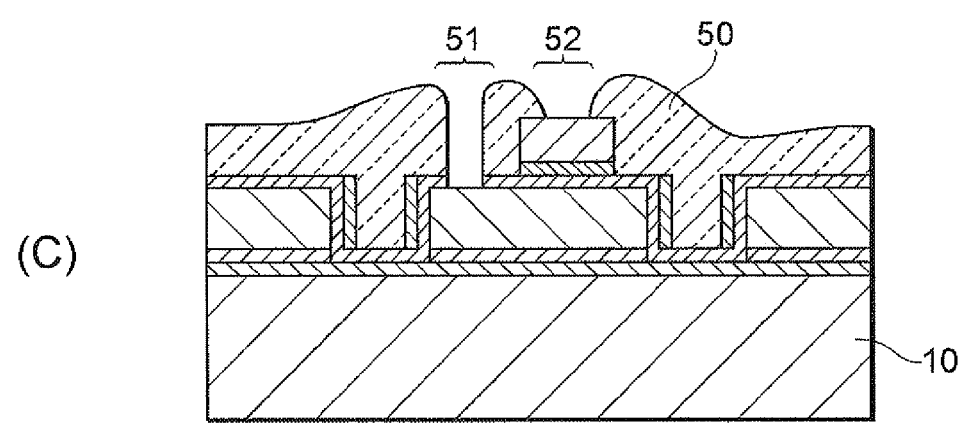

The following describes a device structure and a manufacturing process of a thin film capacitor 100 according to an embodiment of the present invention, with reference to drawings. Note that the same device layers are given the same reference numerals and redundant description is omitted.

Figure 6:
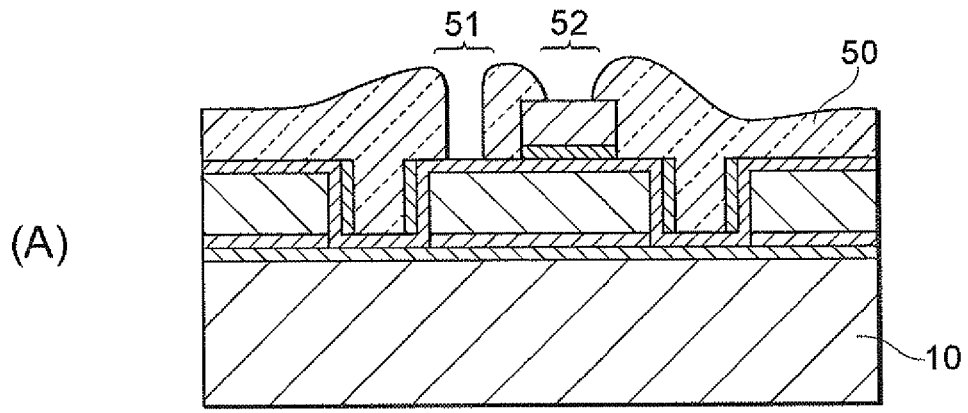
FIG. 6 is a sectional view in the manufacturing process of the thin film capacitor according to the embodiment.
Figure 6:
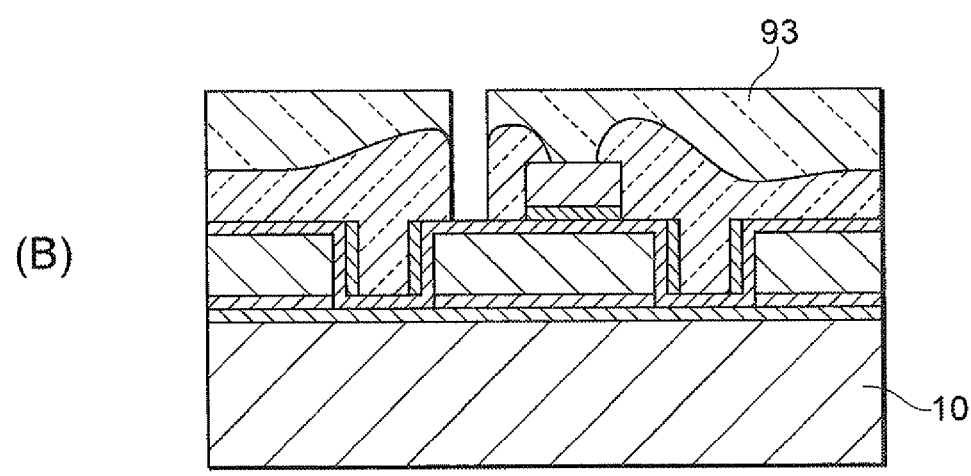
Figure 6:
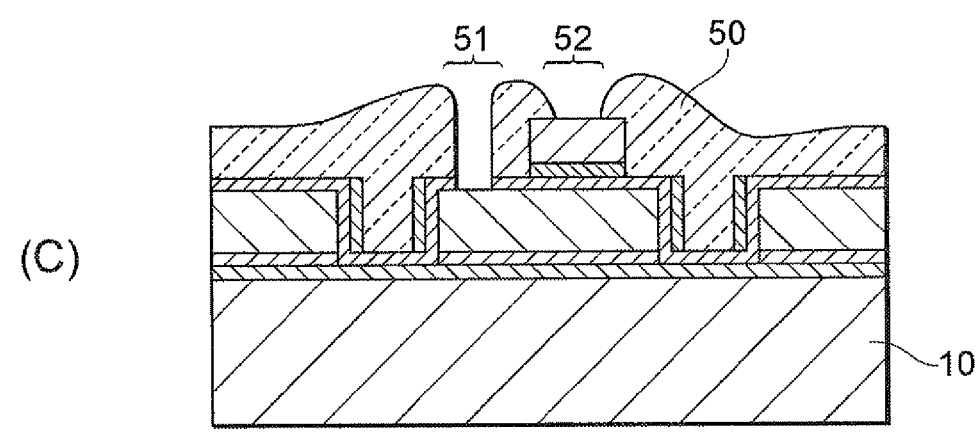

First, the device structure of the thin film capacitor 100 is briefly described below, with reference to FIG. 6A. The thin film capacitor 100 has a device structure in which a lower electrode 20, a dielectric film 30, and an upper electrode 40 are laminated on a substrate 10 in this order. The lower electrode 20 is formed on the substrate 10 via a planarizing layer 11. For example, the lower electrode 20 has a two-layer structure of a seed layer 21 for depositing a metal thin film by electroplating and a conductive layer 22 made of deposited metal. The dielectric film 30 is formed on upper and side surfaces of the lower electrode 20 in an approximately uniform film thickness. The upper electrode 40 is formed on the lower electrode 20 via the dielectric film 30. For example, the upper electrode 40 has a two-layer structure of a seed layer 41 for depositing a metal thin film by electroplating and a conductive layer 42 made of deposited metal. The seed layer 41 on the lower electrode 20 is removed in a process of forming the upper electrode 40, but a part of the seed layer 41 remains on the side surface of the lower electrode 20 via the dielectric film 30 in a manufacturing process. A function of this remaining seed layer 41 will be described later. A laminate structure of the lower electrode 20, the dielectric film 30, and the upper electrode 40 is covered with an insulating film 50. A lower electrode lead portion 61 that passes through the insulating film 50 and electrically connects to the lower electrode 20 and an upper electrode lead portion 62 that passes through the insulating film 50 and electrically connects to the upper electrode 40 are formed on the insulating film 50.

A manufacturing process of the thin film capacitor 100 is described next, with reference to FIGS. 1 to 6. First, as shown in FIG. 1A, the planarizing layer 11 is formed on the substrate 10 using a thin film formation method such as sputtering, and a surface of the planarizing layer 11 is smoothed by performing mirror finishing such as CMP or substrate grinding. The substrate 10 is not particularly limited so long as it is a substrate that is chemically and thermally stable with little stress generation and is capable of maintaining surface smoothness. For example, a silicon single crystal substrate, alumina, sapphire, aluminum nitride, MgO single crystal, $SrTiO_3$ single crystal, surface-oxidized silicon, glass, quartz, and the like are suitable for the substrate 10. The planarizing layer 11 is preferably made of a same material as the substrate 10. For example, alumina, silicon dioxide, and the like are suitable for the planarizing layer 11.

Next, as shown in FIG. 1B, the seed layer 21 for depositing the lower electrode 20 using electroplating is formed on the planarizing layer 11 by sputtering, CVD, or the like. Following this, as shown in FIG. 1C, a resist layer 91 is formed on the seed layer 21 by spin coating, and the resist layer 91 is patterned and removed by a developer so that the seed layer 21 in an area where the lower electrode 20 is formed is surface exposed. Next, as shown in FIG. 2A, the conductive layer 22 is deposited on the surface exposed seed layer 21 using electroplating. For example, the conductive layer 22 can be formed by Cu plating, by immersing the seed layer 21 in a copper ion containing solution that is based on sulfuric acid to which copper sulfate is added and that also contains a predetermined additive, and depositing copper ions in the solution onto the seed layer 21 using the seed layer 21 as a cathode. After the conductive layer 22 is formed in this way, the resist layer 91 remaining on the seed layer 21 is removed as shown in FIG. 2B. The seed layer 21 surface exposed after the removal of the resist layer 91 is then either selectively removed using an etchant or removed by physical etching such as ion milling, as shown in FIG. 2C (note that ion milling is more preferable from a viewpoint of accurately controlling an etching amount). As a result of the above-mentioned process, the lower electrode 20 composed of the seed layer 21 and the conductive layer 22 is formed on the substrate 10.

A material of the lower electrode 20 is not limited to copper, and a known material typically used as electrodes of thin film capacitors is applicable. Examples of the material of the lower electrode 20 include a metal such as Au, Ag, Co, Ni, Cr, Ta, Ti, Pt, Ir, Ru, and Re, an alloy of any of these metals, and a conductive metal oxide. Moreover, a formation method of the lower electrode 20 is not limited to electroplating. For example, sputtering, electron beam evaporation, screen printing, and the like are applicable. Though the conductive layer 22 is not limited to a particular shape, a sectional shape when the conductive layer 22 is cut by a plane perpendicular to the surface of the substrate 10 is preferably an inverted trapezoid where a bottom area of the conductive layer 22 is smaller than a top area of the conductive layer 22. By processing the conductive layer 22 to such a shape, peeling of the insulating film 50 can be effectively suppressed. Note that a metal layer (e.g., chromium, titanium, or the like) for enhancing adhesiveness may be formed between the planarizing layer 11 and the seed layer 21.

Subsequently, as shown in FIG. 3A, the dielectric film 30 is formed on the entire substrate surface including the upper and side surfaces of the lower electrode 20. For example, a paraelectric material such as silicon nitride (SiNx) and silicon oxide (SiOx), a known ferroelectric material, and the like can be used as the dielectric film 30. Examples of the ferroelectric material include a titanate-based material, a stannate-based material, a zirconate-based material, a niobate-based material, tantalate-based material, and a bismuth layered material. Since high insulation is important in thin film capacitor applications, an actual composition may have a composition ratio shifted from a stoichiometric composition, and also more metal oxides may be used in combination. As a formation method of the dielectric film 30, for example, sputtering, plasma CVD, MOCVD, a sol-gel process, electron beam evaporation, and the like are applicable.

Next, as shown in FIG. 3B, the seed layer 41 for depositing the upper electrode 40 using electroplating is formed on an entire surface of the dielectric film 30 by sputtering, CVD, or the like. Following this, as shown in FIG. 3C, a resist layer 92 is formed on the seed layer 41 by spin coating, and the resist layer 92 is patterned and removed by a developer so that the seed layer 41 in an area where the upper electrode 40 is formed is surface exposed. Next, as shown in FIG. 4A, the conductive layer 42 is deposited on the surface exposed seed layer 41 using electroplating. After the conductive layer 42 is formed, the resist layer 92 remaining on the seed layer 41 is removed as shown in FIG. 4B. Though the conductive layer 42 is not limited to a particular shape, a sectional shape when the conductive layer 42 is cut by a plane perpendicular to the surface of the substrate 10 is preferably an inverted trapezoid where a bottom area of the conductive layer 42 is smaller than a top area of the conductive layer 42. By processing the conductive layer 42 to such a shape, peeling of the insulating film 50 can be effectively suppressed.

Next, as shown in FIG. 4C, the seed layer 41 exposed on the upper surface of the lower electrode 20 after the removal of the resist layer 92 is removed by physical anisotropic etching by ion irradiation such as ion milling. Here, to smoothly mill the surface of the seed layer 41, a method of applying an ion beam obliquely with respect to the substrate surface is effective. In this method, however, the ion beam is difficult to impinge on an area where wiring (not illustrated) is intricate. Even when, for example, a means for rotating the substrate 10 is provided, a milling rate in such an area is relatively slower than a milling rate in an area without intricate wiring. As a result, a milling amount inevitably increases in order to completely remove the seed layer 41 in the area with intricate wiring. Since a withstand voltage of the thin film capacitor 100 depends on a film thickness of the dielectric film 30 remaining on the lower electrode 20 after the milling of the seed layer 41, a milling method that minimizes overetching of the dielectric film 30 is desirable for suppressing a decrease in withstand voltage.

As a milling method that minimizes overetching, the ion beam is applied approximately vertically with respect to the substrate surface in this embodiment. By doing so, a difference in milling rate between the area with intricate wiring and the area without intricate wiring can be reduced, as a result of which overetching of the dielectric film 30 in the area without intricate wiring can be minimized while reliably milling the seed layer 41 in the area with intricate wiring. Note, however, that overetching may be performed up to the dielectric film 30 under the seed layer 41 which is exposed on the upper surface of the lower electrode 20 so that the film thickness of the dielectric film 30 formed between the lower electrode 20 and the upper electrode 40 is larger than the film thickness of the dielectric film 30 formed other than between the lower electrode 20 and the upper electrode 40. When the seed layer 41 exposed on the upper surface of the lower electrode 20 is removed by physical etching such as ion milling, the seed layer 41 remains on the side surface of the lower electrode 20 via the dielectric film 30. As a result of the above-mentioned process, the upper electrode 40 composed of the seed layer 41 and the conductive layer 42 is formed on the dielectric film 30.

Next, as shown in FIG. 5A, the insulating film 50 is formed on the substrate 10 on which the lower electrode 20, the dielectric film 30, and the upper electrode 40 have been formed, and an opening 51 for exposing a part of the dielectric film 30 on the lower electrode 20 and an opening 52 for exposing a part of the upper electrode 40 are formed in the insulating film 50. The insulating film 50 is not particularly limited so long as it is an insulating thin film having a proper thermal resistance and mechanical strength. For example, $Si_3N_4$, $SiO_2$, a polyimide resin, BCB (benzocyclobutene), and the like are suitable for the insulating film 50. In the case of using a polyimide resin as the insulating film 50, for example, polyimide is applied by spin coating and solidified by a heat treatment, and the insulating film 50 is selectively etch-removed by reactive ion etching using a resist film (not illustrated) patterned in accordance with the shapes of the openings 51 and 52 as a mask, thereby forming the openings 51 and 52.

Next, as shown in FIG. 5B, a through hole formation resist layer 93 that covers the insulating film 50 except the opening 51 is formed. As shown in FIG. 5C, the dielectric film 30 exposed at the bottom of the opening 51 is selectively removed by etching using the resist layer 93 as a mask, thereby forming a through hole for the lower electrode 20. After the formation of the through hole, the resist layer 93 is removed, and the lower electrode lead portion 61 led from the opening 51 and electrically connected to the lower electrode 20 and the upper electrode lead portion 62 led from the opening 52 and electrically connected to the upper electrode 40 are formed as shown in FIG. 6A. A material of the lower electrode lead portion 61 and the upper electrode lead portion 62 is not particularly limited so long as it is a conductive material suitable for various thin film formation methods such as sputtering and electron beam evaporation. For example, in the case of using aluminum, the lower electrode lead portion 61 connected to the lower electrode 20 and the upper electrode lead portion 62 connected to the upper electrode 40 may be formed by forming an aluminum thin film on the insulating film 50 and patterning the aluminum thin film by reactive ion etching using a halogen atom containing gas (e.g., chlorine-based gas). The lower electrode lead portion 61 and the upper electrode lead portion 62 formed on the insulating film 50 effectively suppress peeling between the insulating film 50 and the substrate 10.

Next, as shown in FIG. 6B, a resin seal layer 70 that covers the surface exposed insulating film 50, the lower electrode lead portion 61, and the upper electrode lead portion 62 is formed. After this, as shown in FIG. 60, a side terminal 80 of the thin film capacitor 100 is formed by, for example, barrel plating or the like. As a result of the above-mentioned process, the thin film capacitor 100 is completed.

The thin film capacitor 100 manufactured according to the manufacturing process described above has the following features.

(1) Adhesion Layer

The seed layer 41 remaining on the side surface of the lower electrode 20 via the dielectric film 30 has high chemical reactivity, and is superior to the chemically stable dielectric film 30 in terms of adhesiveness to the insulating film 50. Accordingly, the seed layer 41 remaining on the side surface of the lower electrode 20 via the dielectric film 30 functions as an adhesion layer for suppressing peeling between the insulating film 50 and the substrate 10. Such an adhesion layer is not limited to the above-mentioned seed layer 41. For example, the adhesion layer may be a metal film that remains on the side surface of the lower electrode 20 via the dielectric film 30 in a manufacturing process of the thin film capacitor 100 and also has a property of high chemical reaction (oxidation reaction is particularly preferable) with the dielectric film 30. Moreover, in consideration of a stress that acts between the adhesion layer and the insulating film 50 during thermal expansion or thermal contraction, it is desirable that a difference between a thermal expansion coefficient of the metal film functioning as the adhesion layer and a thermal expansion coefficient of the insulating film 50 is small.

An Example and a Comparative Example for assessing the effectiveness of the seed layer 41 as the adhesion layer are given below.

Example

A Cu film (seed layer) was formed by sputtering on a SiNx film (dielectric film) formed by plasma CVD. A photosensitive polyimide resin (insulating film) was formed on the Cu film (seed layer) and patterned to various sizes (6 μm to 30 μm squares). PN2050 manufactured by Toray Industries, Inc. was used as the photosensitive polyimide resin. The polyimide resin (insulating film) after a developer was sprayed by showers did not peel away in any size. This result indicates favorable adhesiveness between the Cu film (seed layer) and the polyimide resin (insulating film).

Comparative Example

A photosensitive polyimide resin (insulating film) was formed on a SiNx film (dielectric film) formed by plasma CVD, and patterned to various sizes (6 μm to 30 μm squares). PN2050 manufactured by Toray Industries, Inc. was used as the photosensitive polyimide resin. The polyimide resin (insulating film) after a developer was sprayed by showers peeled away in all sizes. This result indicates poor adhesiveness between the SiNx film (dielectric film) and the polyimide resin (insulating film).

(2) Withstand Voltage Performance and Processing Accuracy

By applying the ion beam approximately vertically with respect to the substrate surface, the difference in milling rate between the area with intricate wiring and the area without intricate wiring can be reduced, which allows the milling amount of the dielectric film 30 when removing the seed layer 41 to be minimized. Hence, a decrease in withstand voltage of the thin film capacitor 100 can be suppressed. Moreover, a capacitance of the thin film capacitor 100 is determined by a facing area of the upper electrode 40 and the lower electrode 20 and a permittivity and film thickness of the dielectric film 30. This being so, by using ion milling that enables more accurate etching control than wet etching whose etching rate can vary depending on a solution temperature or a flow speed, the shape of the upper electrode 40 can be accurately processed to thereby reduce a variation in capacitance.

The manufacturing method described above is not limited to a thin film capacitor, but is applicable to various devices. For instance, the manufacturing method described above may be applied to manufacture of an LC filter such as a bandpass filter that combines a thin film capacitor and an inductance. As an example, such an LC filter can be manufactured by forming the thin film capacitor and the inductance on a same substrate and electrically connecting an electrode of the thin film capacitor with the inductance.

The thin film capacitor according to the present invention can be widely used in semiconductor devices, mounting circuit boards, electronic circuits, and so on.

The present application is based on Japanese priority application No. 2009-076077 filed on Mar. 26, 2009, the entire content of which is hereby incorporated by reference.

What is claimed is:

1. A thin film capacitor having a laminate structure that is formed by laminating a first electrode, a dielectric film, and a second electrode in sequence on a substrate, the thin film capacitor comprising:
    an adhesion layer;
    an insulating film,
    wherein the dielectric film is formed on a lateral face and on a top face of the first electrode,
    the adhesion layer is formed on the lateral face and on a first part of the top face of the first electrode via the dielectric film,
    the second electrode is formed on the first part of the top face of the first electrode via the dielectric film and the adhesion layer,
    the insulating film covers a second part of the top surface of the first electrode via the dielectric film and the lateral face of the first electrode via the dielectric film and the adhesion layer, and
    a thickness of the insulating film covering the lateral face of the first electrode via the dielectric film and the adhesion layer is greater than a thickness of the insulating film covering the second part of the top surface of the first electrode via the dielectric film.

2. The thin film capacitor according to claim 1, wherein the adhesion layer is made of a material that oxidizes more easily than the dielectric film.

3. The thin film capacitor according to claim 1, further comprising
    an electrode lead portion that is led from an opening in the insulating film and electrically connected to the second electrode.

4. The thin film capacitor according to claim 2, further comprising
    an electrode lead portion that is led from an opening in the insulating film and electrically connected to the second electrode.

* * * * *